United States Patent
Kang et al.

(10) Patent No.: US 9,722,600 B2
(45) Date of Patent: Aug. 1, 2017

(54) DRIVING CIRCUIT OF SWITCHING DEVICE FOR ELECTRIC POWER CONTROL

(71) Applicant: LSIS CO., LTD., Gyeonggi-do (KR)

(72) Inventors: Sung-Hee Kang, Gyeonggi-do (KR); Kyoung-Hun Nam, Gyeonggi-do (KR)

(73) Assignee: LSIS CO., LTD., Gyeonggi-Do (KR)

(*) Notice: Subject to any disclaimer, the term of this patent is extended or adjusted under 35 U.S.C. 154(b) by 0 days.

(21) Appl. No.: 15/209,636

(22) Filed: Jul. 13, 2016

(65) Prior Publication Data

US 2017/0019098 A1    Jan. 19, 2017

(30) Foreign Application Priority Data

Jul. 16, 2015  (KR) .................. 10-2015-0101241

(51) Int. Cl.
| | |
|---|---|
| *H03K 3/00* | (2006.01) |
| *H03K 17/567* | (2006.01) |
| *H02M 1/08* | (2006.01) |
| *H03K 17/18* | (2006.01) |
| *H03K 17/687* | (2006.01) |
| *H03K 19/0175* | (2006.01) |

(52) U.S. Cl.
CPC ............ *H03K 17/567* (2013.01); *H02M 1/08* (2013.01); *H03K 17/18* (2013.01); *H03K 17/687* (2013.01); *H03K 19/017509* (2013.01)

(58) Field of Classification Search
CPC .................................................. H03K 17/567
See application file for complete search history.

(56) References Cited

U.S. PATENT DOCUMENTS

| 2008/0309302 A1* | 12/2008 | Chen .................. H02M 1/38 323/282 |
|---|---|---|
| 2009/0296433 A1 | 12/2009 | Sihler et al. |
| 2011/0182094 A1 | 7/2011 | Lumsden et al. |
| 2013/0234777 A1 | 9/2013 | Iwama |

FOREIGN PATENT DOCUMENTS

| DE | 4100790 A1 | 7/1992 |
|---|---|---|
| EP | 1988633 A1 | 5/2008 |
| EP | 2814173 A1 | 12/2014 |
| KR | 10-0275037 B1 | 12/2000 |
| KR | 10-0528674 B1 | 11/2005 |
| KR | 10-2014-0076382 A | 6/2014 |
| WO | 2012-050635 A1 | 4/2012 |

OTHER PUBLICATIONS

European Search Report dated Dec. 9, 2016 for corresponding Application No. 16171921.6.

* cited by examiner

*Primary Examiner* — Daniel Puentes
(74) *Attorney, Agent, or Firm* — Nath, Goldberg & Meyer; Jerald L. Meyer; Leonid D. Thenor

(57) ABSTRACT

In some embodiments, a driving circuit of a switching device for an electric power control capable of improving reliability of an ON/OFF driving and a monitoring operation of a switching device by configuring a configuration for the ON/OFF driving and the monitoring operation of the switching device in plural numbers is presented. A driving circuit of a switching device for an electric power control may include a driver circuit unit, a first logic device, a second logic device, and a controller.

8 Claims, 4 Drawing Sheets

PRIOR ART

DRIVING CIRCUIT OF SWITCHING DEVICE FOR ELECTRIC POWER CONTROL

CROSS REFERENCE TO RELATED APPLICATIONS

This application claims the benefit of Korean Patent Application No. 10-2015-0101241, filed on Jul. 16, 2015 and entitled "DRIVING CIRCUIT OF SWITCHING DEVICE FOR ELECTRIC POWER CONTROL," which is hereby incorporated by reference in its entirety.

BACKGROUND

Technical Field

Embodiments of the present disclosure relate to a driving circuit of a switching device for an electric power control, and more particularly, to a driving circuit of a switching device for an electric power control capable of improving reliability of an ON/OFF driving and a status monitoring.

Description of the Related Art

For controlling electric power being supplied to an alternating current motor, a semiconductor switching device for an electric power control, such as an insulated gate bipolar transistor (IGBT), a metal oxide semiconductor field effect transistor (MOSFET) and the like, is used for an electric power conversion or an electric power control in which an alternating current is converted into a direct current and the direct current is again converted into the alternating current through an inverter.

The present disclosure relates to a driving circuit of such a semiconductor switching device for an electric power control.

In a driving circuit of such a semiconductor switching device for an electric power control, the related art will be described below with reference to FIG. 1.

As shown in FIG. 1, a driving circuit of a semiconductor switching device for an electric power control according to the related art is configured to include a driver circuit unit 20 and a control circuit 10.

In FIG. 1, a reference numeral 30 is a semiconductor switching device (hereinafter, referred to as a switching device) which is a target of an ON or OFF driving of a driving circuit.

The switching device 30 may be typically configured with the IGBT or the MOSFET described above.

The switching device 30 may have an emitter, a gate, and a collector, and may be turned on or off according to a voltage difference between the emitter and the gate. For example, the switching device 30 is turned on when a voltage difference between the emitter and the gate is in a range of 12 to 20 volts (V), whereas it is turned off when the voltage difference between the emitter and the gate is in a range of 0 to 11 V.

Also, when the switching device 30 is in an ON state, a voltage difference between the emitter and the collector is decreased from ten to tens of volts in an OFF state to 2 to 3 volts, and it may be determined whether or not the switching device 30 is in an ON state by detecting a collector voltage. However, according to an amount of current flowing between the emitter and the collector, a variation of a voltage difference therebetween may occur.

The driver circuit unit 20 is connected to the gate and the collector of the switching device 30, and is a circuit unit which outputs a driving signal to the gate to drive the switching device 30 to an ON state or stops the outputting of the driving signal to change the switching device 30 from the ON state to an OFF state. Here, the driving signal may be a current signal of, for example, about several amperes, or a voltage signal of, for example, ten to tens of volts.

The driver circuit unit 20 may be configured with an integrated circuit for outputting the driving signal.

The driver circuit unit 20 may receive a voltage detection signal representing a collector voltage value of the switching device 30 from the collector thereof.

A reference numeral 40a represents a transmission side circuit which transmits the voltage detection signal to the driver circuit unit 20.

In FIG. 1, a reference numeral 40 represents a protective diode of the transmission side circuit 40a, which is conducting when a voltage of the transmission side circuit 40a is higher than a collector voltage of the switching device 30.

Also, the driver circuit unit 20 provides the control circuit 10 with the collector voltage value according to the voltage detection signal received from the collector of the switching device 30 and a monitoring signal representing a state of the driver circuit unit 20. Further, in FIG. 1, an arrow indicating a left side between the driver circuit unit 20 and the control circuit 10 shows a transmission of the monitoring signal.

The control circuit 10 is connected to the driver circuit unit 20 to output an ON or OFF control instruction signal regarding the switching device 30 to the driver circuit unit 20. In FIG. 1, an arrow indicating a right side between the driver circuit unit 20 and the control circuit 10 shows a transmission of the ON or OFF control instruction signal.

Therefore, the control circuit 10 may determine a current ON/OFF state of the switching device 30 and a current state of the driver circuit unit 20 based on the monitoring signal provided from the driver circuit unit 20.

However, the driving circuit of a semiconductor switching device for an electric power control according to the related art is configured to perform an ON/OFF driving and a state monitoring of the switching device 30 by means of only the single driver circuit unit 20. Consequently, when a malfunction such as a burning of the single driver circuit unit 20 occurs, there is a problem in which the ON/OFF driving and the state monitoring of the switching device 30 are broken down.

SUMMARY

Therefore, the present disclosure is provided to address the aforementioned problems, and an object of some embodiments of the present disclosure is to provide a driving circuit of a switching device for an electric power control capable of improving reliability of an ON/OFF driving and a state monitoring operation of the switching device by configuring a multiplexing configuration for the ON/OFF driving and the state monitoring operation of the switching device.

The object of some embodiments of the present disclosure may be obtained by providing a driving circuit of a switching device for an electric power control which includes a driver circuit unit connected to the switching device and configured to control the switching device to an ON state or an OFF state, a first logic device connected to the switching device and the driver circuit unit and configured to transmit an ON or OFF control signal regarding the switching device to the driver circuit unit or to provide a monitoring signal detecting an ON state or an OFF state of the switching device to the driver circuit unit, a second logic device connected to the switching device and the first logic device and configured to transmit an ON or OFF control signal regarding the switching device to the first logic device or to provide a monitoring signal detecting an ON state or an OFF state of the switching device to the first logic device, and a controller connected to the first logic device and the second logic device and configured to provide an ON or OFF control instruction signal regarding the switching device to at least one of the first logic device and the second logic device.

In accordance with one aspect of some embodiments of the present disclosure, the driver circuit unit may include a plurality of driver circuits commonly connected to the switching device in duplicate and configured to control the switching device to be turn on or off.

In accordance with another aspect of some embodiments of the present disclosure, the first logic device and the second logic device may be connected to a gate and a collector of the switching device so as to receive the monitoring signal detecting the ON state or the OFF state of the switching device.

In accordance with still another aspect of some embodiments of the present disclosure, level down shifters connected between the second logic device and the gate of the switching device, between the second logic device and the collector of the switching device, and between the first logic device and the gate of the switching device, respectively, and configured to lower a voltage level of the monitoring signal may be further included.

In accordance with yet another aspect of some embodiments of the present disclosure, when the monitoring signals regarding the ON state or the OFF state of the switching device are different from each other, which are received from the first logic device and the second logic device, respectively, the controller may be configured to determine that an abnormality occurs in one of the first logic device and the second logic device.

In accordance with yet another aspect of some embodiments of the present disclosure, the controller may be configured to determine a logic device in which an abnormality occurs out of the first logic device and the second logic device based on the ON or OFF control instruction signal and the monitoring signals regarding the ON state or the OFF state of the switching device, which are received from the first logic device and the second logic device, respectively.

In accordance with yet another aspect of some embodiments of the present disclosure, each of the first logic device and the second logic device may be configured with one of a field programmable gate array (FPGA), a microcomputer unit (MCU), a complex programmable logic device (CPLD), and an application-specific integrated circuit (ASIC).

In accordance with yet another aspect of some embodiments of the present disclosure, a resistor connected between the driver circuit unit and the gate of the switching device and configured to make a gate driving signal for controlling the switching device to an ON state or an OFF state into a predetermined voltage signal may be further included. In accordance with yet another aspect of some embodiments of the present disclosure, the level down shifters may be configured with one of a resistor rail, a comparator, and an operational amplifier.

The driving circuit of a switching device of an electric power control according to some embodiments of the present disclosure may include a logic device connected between the driver circuit unit and the controller and configured to transmit an ON or OFF control instruction signal regarding the switching device to the driver circuit unit and to monitor an ON state or an OFF state of the switching device to transmit the monitoring result, and may be configured to have a multiplexing configuration of the logic devices, thereby providing effectiveness capable of improving reliability of an ON/OFF control and a monitoring operation of the switching device in comparison with the related art.

In the driving circuit of a switching device for an electric power control according to some embodiments of the present disclosure, the driver circuit unit may be configured with a plurality of driver circuits such that it may be possible to provide effectiveness capable of preventing a breakdown of an OF/OFF control and a monitoring operation of the switching device even when a malfunction occurs in one of the plurality of driver circuits.

In the driving circuit of a switching device for an electric power control according to some embodiments of the present disclosure, because of being connected to the gate and the collector of the switching device, the first logic device and the second logic device may detect and calculate a gate voltage and a collector voltage of the switching device and a voltage difference therebetween such that it may be possible to provide effectiveness capable of exactly determining an ON state or an OFF state of the switching device.

The driving circuit of a switching device for an electric power control according to some embodiments of the present disclosure may further include the level down shifters, so that it may be possible to provide effectiveness capable of lowering and providing a voltage level of a monitoring signal to a level suitable for an input voltage of the first logic device and the second logic device.

In the driving circuit of a switching device for an electric power control according to some embodiments of the present disclosure, when the monitoring signals regarding an ON state or an OFF state of the switching device are different from each other, which are received from the first logic device and the second logic device, respectively, the controller may determine that one of the first logic device and the second logic device is abnormal, by means of the logic circuits included in the controller or the process program, so that it may be possible to provide effectiveness capable of monitoring whether or not the logic devices are in a normal state.

The driving circuit of a switching device for an electric power control according to some embodiments of the present disclosure may provide effectiveness that the controller may exactly determine a logic device in which an abnormality occurs out of the first logic device and the second logic device based on data of the ON or OFF control instruction signal output from the controller and the monitoring signals regarding an ON state or an OFF state of the switching device.

In the driving circuit of a switching device for an electric power control according to some embodiments of the present disclosure, each of the first logic device and the second logic device may be configured with one of an FPGA, an MCU, a CPLD, and an ASIC, so that it may be possible to provide effectiveness capable of selectively configuring the logic device.

The driving circuit of a switching device of an electric power control may include the resistor connected between the driver circuit unit and the gate of the switching device, so that it may be possible to provide effectiveness capable of making the gate driving signal into a predetermined voltage signal.

In the driving circuit of a switching device for an electric power control, the level down shifters may be configured with one of a resistor rail, a comparator, and an operational amplifier, so that it may be possible to provide effectiveness capable of selectively configuring the level down shifters.

DETAILED DESCRIPTION

Figure 1:
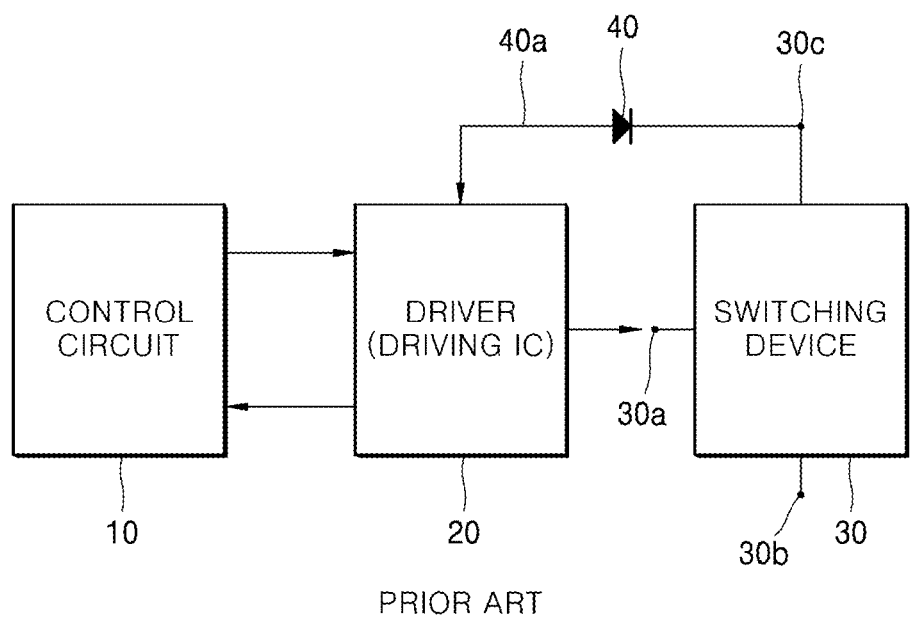
FIG. 1 is a block diagram illustrating a configuration of a driving circuit of a switching device for an electric power control according to prior art.
Figure 2:
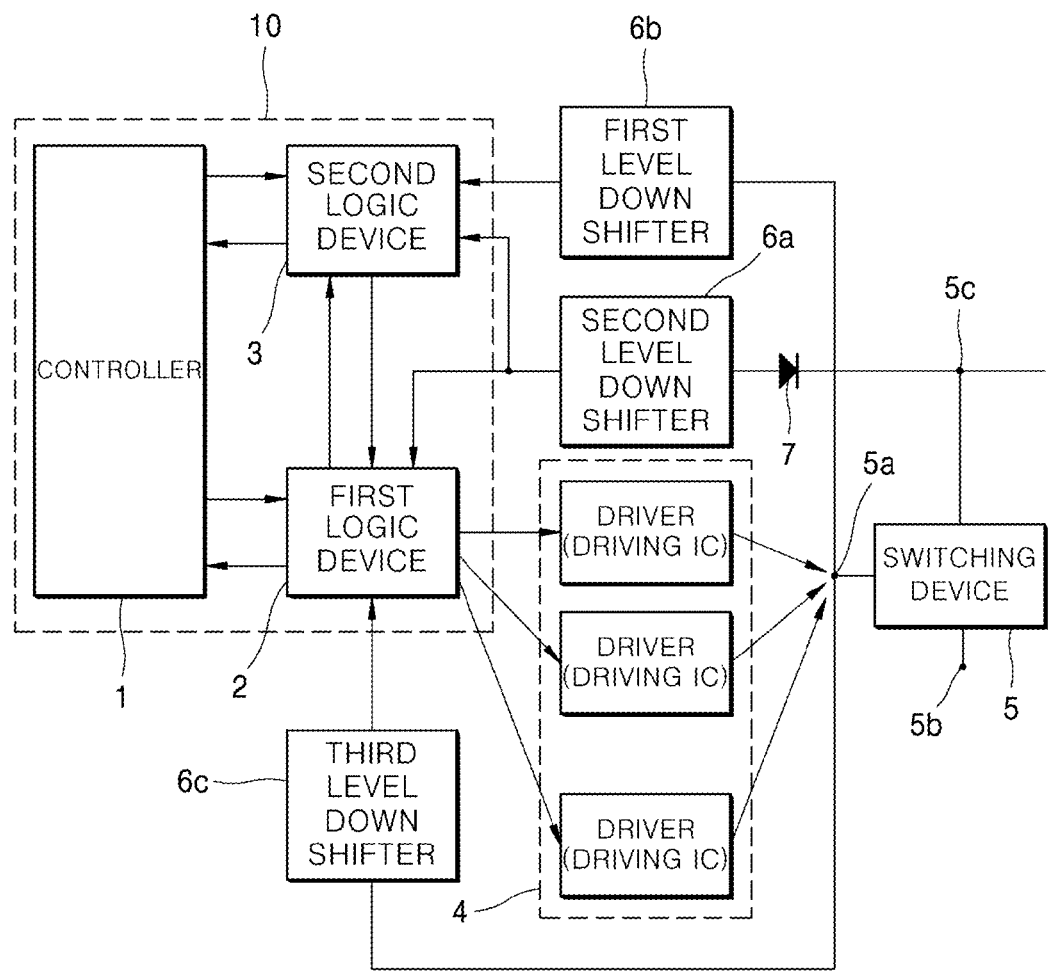
FIG. 2 is a block diagram illustrating a configuration of a driving circuit of a switching device for an electric power control according to an embodiment of the present disclosure.

Objects of some embodiments of the present disclosure described above, configurations for attaining these objects and effectiveness thereof will be apparently understood from the following description with reference to FIG. 2 regarding a driving circuit of a switching device for an electric power control according to one embodiment of the present disclosure.

With reference to FIG. 2, a driving circuit of a switching device for an electric power control according to an embodiment of the present disclosure may be configured to include a driver circuit unit 4, a first logic device 2, a second logic device 3, and a controller 1.

In FIG. 2, a reference numeral 5 represents a switching device for an electric power control (hereinafter, referred to as a switching device) configured with, for example, an IGBT or a MOSFET, and includes a gate 5a, an emitter 5b, and a collector 5c.

The switching device 5 is turned on or off according to a voltage difference between the emitter 5b and the gate 5a. For example, the switching device 5 is turned on when a voltage difference between the emitter 5b and the gate 5a is in a range of 12 to 20 V, whereas it is turned off when a voltage difference between the emitter 5b and the gate 5a is in a range of 0 to 11 V.

Also, when the switching device 5 is in an ON state, a voltage difference between the emitter 5b and the collector 5c is decreased from ten to tens of volts in an OFF state to 2 to 3 volts, and it may be determined whether or not the switching device 5 is in an ON state by detecting a collector voltage.

According to an, embodiment, the emitter 5b of the switching device 5 may be connected to a ground of a circuit or a ground of a printed circuit board.

Also, according to an, embodiment, an output terminal (See a right arrow of the connector in FIG. 2) of the collector 5c of the switching device 5 may be connected to an electric power supply unit for an electric power conversion or a circuit unit required for an electric power switching.

The driver circuit unit 4 is connected to the switching device 5 and provides a driving signal thereto so as to control the switching device 5 to an ON state or an OFF state.

Here, the driving signal may be a current signal of, for example, several amperes, or a voltage signal of, for example, ten to tens of volts.

The driver circuit unit 4 may be configured with an integrated circuit for outputting the driving signal.

In accordance with one aspect of some embodiments of the present disclosure, even when a malfunction occurs in any one driver circuit unit, a breakdown of an ON/OFF control and a monitoring operation of the switching device 5 may be prevented. For this purpose, the driver circuit unit 4 is configured to include a plurality of driver circuits, and the plurality of driver circuits are commonly connected in duplicate to the single switching device 5 in parallel.

In accordance with one aspect of some embodiments of the present disclosure, a resistor, which makes a gate driving signal for controlling the switching device 5 to an ON state or an OFF state into a predetermined voltage signal, may be connected between the driver circuit unit 4 and the gate 5a of the switching device 5.

The first logic device 2 is connected to the switching device 5 and the driver circuit unit 4 to transmit an ON or OFF control signal regarding the switching device 5 to the driver circuit unit 4, or to provide the driver circuit unit 4 with a monitoring signal detecting an ON state or an OFF state of the switching device 5.

The second logic device 3 is connected to the switching device 5 and the first logic device 2 to transmit an ON or OFF control signal regarding the switching device 5 to the first logic device 2, or to provide the first logic device 2 with a monitoring signal detecting an ON state or an OFF state of the switching device 5.

In order to receive the monitoring signal detecting an ON state or an OFF state of the switching device 5, the first logic device 2 and the second logic device 2 are connected to the gate 5a and the collector 5c of the switching device 5, respectively.

Each of the first logic device 2 and the second logic device 3 may be configured with one of a field programmable gate array (FPGA), a microcomputer unit (MCU), a complex programmable logic device (CPLD), and an application-specific integrated circuit (ASIC).

The driving circuit of a switching device for an electric power control according to an embodiment of the present disclosure includes a first level down shifter 6b, a second level down shifter 6a, and a third level down shifter 6c.

The first level down shifter 6b, the second level down shifter 6a, and the third level down shifter 6c are connected between the second logic device 3 and the gate 5a of the switching device 5, between the first and second logic devices 2 and 3 and the collector 5c of the switching device 5, and between the first logic device 2 and the gate 5a of the switching device 5, respectively, thereby lowering a voltage level of the monitoring signal. In other words, each of the first level down shifter 6b, the second level down shifter 6a, and the third level down shifter 6c may lower a voltage level of the monitoring signal to a voltage level of, for example, 3.3 volts suitable for an input voltage level of the first logic device 2 and the second logic device 3, thereby providing the lowered voltage thereto.

In accordance with one aspect of some embodiments of the present disclosure, each of the first level down shifter 6b, the second level down shifter 6a, and the third level down shifter 6c may be configured with one of a resistor rail, a comparator, and an operational amplifier.

With reference to FIG. 2, a diode 7 for protecting a circuit to a transmission path of a monitoring signal is connected between the second level down shifter 6a and the collector 5c of the switching device 5.

When a voltage at a transmission path of a monitoring signal, the transmission path transmitting a collector voltage representing an ON state or an OFF state of the switching device 5 to the second logic device 3, that is, a voltage of an output terminal of the second level down shifter 6a is higher than that of the collector 5c of the switching device 5, the diode 7 is conducting. Otherwise, the diode 7 is not conducting to protect the second level down shifter 6a, the second logic device 3, and the controller 1, which are disposed in a post-stage.

The controller 1 is connected to the first logic device 2 and the second logic device 3, and may provide an ON or OFF control instruction signal regarding the switching device 5 to at least one of the first logic device 2 and the second logic device 3.

Also, the controller 1 may determine an abnormal state of at least one of the first logic device 2 and the second logic device 3 based on the monitoring signals therefrom.

According to one embodiment, the controller 1 may be configured with a microcomputer including a central processing unit for performing an arithmetic operation and a process based on a process program, a process program, a reference value, and a memory for storing a value of the arithmetic operation.

When the monitoring signals regarding an ON state or an OFF state of the switching device 5 are different from each other, which are received from the first logic device 2 and the second logic device 3, respectively, the controller 1 may be configured to determine that one of the first logic device 2 and the second logic device 3 is abnormal. For this purpose, the controller 1 may be configured with a logic circuit for such a logical determination, and may be configured to have a structure in which a central processing unit reads a process program from a memory and compares the monitoring signals with each other according to the process program to determine whether or not the monitoring signals are the same as each other.

The controller 1 may be configured to exactly determine a logic device in which an abnormality (malfunction) occurs out of the first logic device 2 and the second logic device 3 based on the ON or OFF control instruction signal, and the monitoring signals regarding an ON state or an OFF state of the switching device 5 which are received from the first logic device 2 and the second logic device 3, respectively.

The controller 1, the first logic device 2, and the second logic device 3 may be configured as a single control circuit 10.

Figure 3:
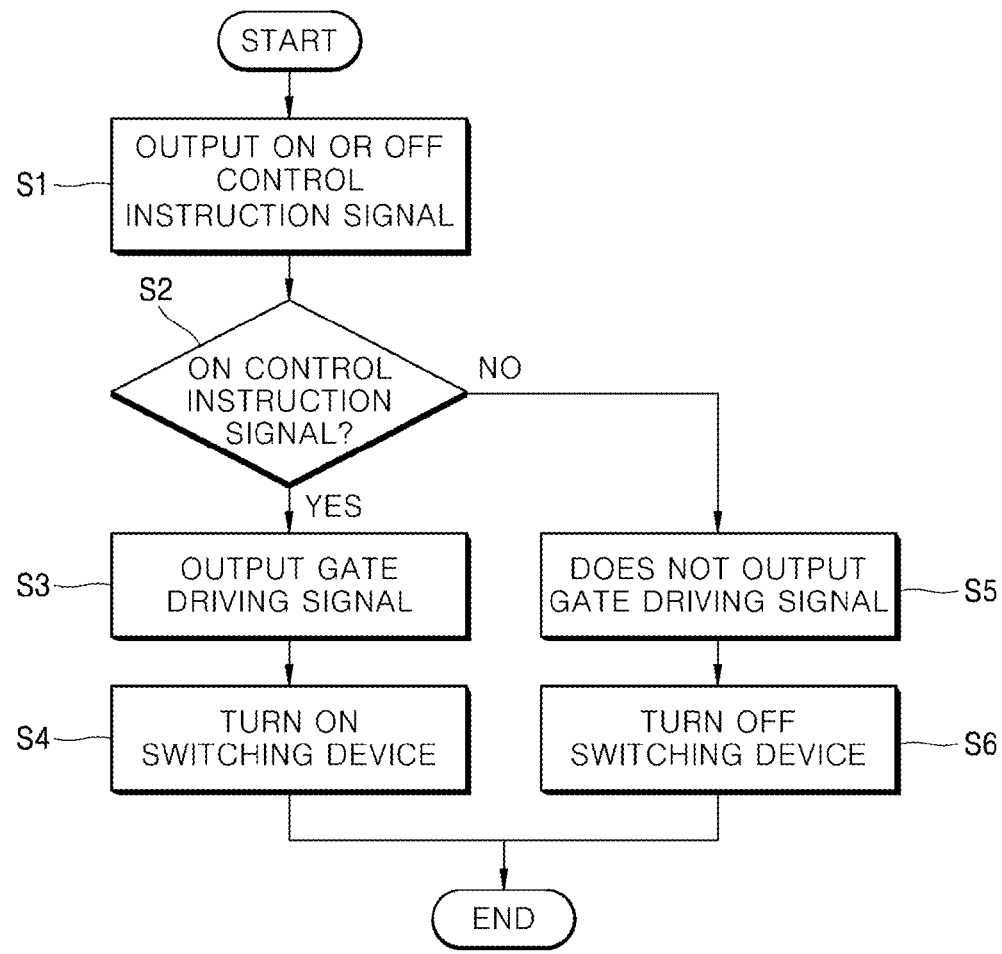
FIG. 3 is a flowchart illustrating an ON or OFF control instruction of a controller and an ON/OFF operation process of a switching device according to the ON or OFF control instruction in the driving circuit of a switching device for an electric power control according to an embodiment of the present disclosure.

An operation of the driving circuit configured as described above of a switching device for an electric power control according to some embodiments of the present disclosure will be described with reference to FIGS. 2 and 3.

Firstly, an ON or OFF control instruction of the controller 1 and an ON/OFF operation of a switching device according thereto will be described.

When the controller 1 outputs an ON or OFF control instruction signal so as to turn on or off the switching device 5, the first logic device 2 and the second logic device 3 receive the ON or OFF control instruction signal in Operation S1.

And, in response to the ON or OFF control instruction signal, the first logic device 2 transmits an ON or OFF control signal regarding the switching device 5 to the driver circuit unit 4.

When the signal transmitted from the first logic device 2 is an ON control instruction signal ("YES" in Operation S2), the plurality of driver circuits configuring the driver circuit unit 4 commonly provide the gate 5a of the switching device 5 with gate driving signals in duplicate in Operation S3.

On the other hand, when the signal transmitted from the first logic device 2 is an OFF control instruction signal ("NO" in Operation S2), the plurality of driver circuits configuring the driver circuit unit 4 commonly do not output the gate driving signals to the gate 5a of the switching device 5 in Operation S5.

When the driver circuit unit 4 outputs the gate driving signals, a voltage difference between an emitter voltage which is a ground potential of the switching device 5 and a gate voltage formed by the gate driving signals is greatly increased to about 12 to 20 volts. Consequently, the switching device 5 is to be an ON state (that is, is turned on) in Operation S4.

On the other hand, when the driver circuit unit 4 does not output the gate driving signals, a voltage difference between the emitter voltage which is the ground potential of the switching device 5 and a gate voltage formed by the gate driving signals is greatly decreased to about 0 to 11 volts. Consequently, the switching device 5 is to be an OFF state (that is, is turned off) in Operation S6.

Figure 4:
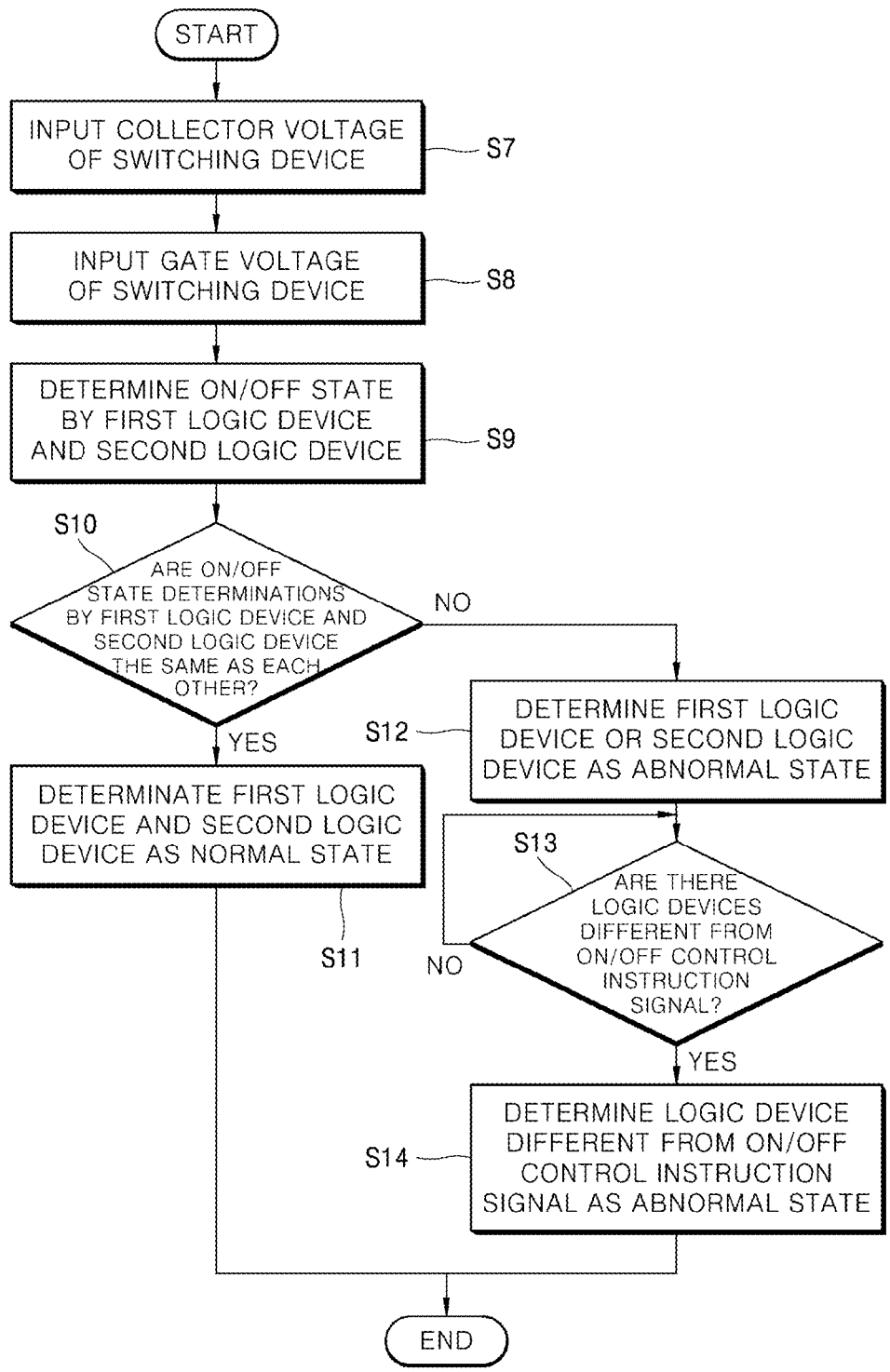
FIG. 4 is a flowchart illustrating a process for a determination operation of an ON state or an OFF state of a switching device and an abnormality (malfunction) occurrence determination operation of a logic device in the driving circuit of a switching device for an electric power control, according to an embodiment of the present disclosure.

Next, a determination operation regarding an ON state or an OFF state of the switching device 5 and an abnormality (malfunction) occurrence determination operation of a logic device will be described with reference to FIGS. 2 and 4.

When the switching device 5 is in an ON state, a voltage difference between the emitter 5b and the collector 5c is decreased from ten to tens of volts in an OFF state to 2 to 3 volts.

As a result, a collector voltage is also decreased to 2 to 3 volts to be lower than a voltage at the transmission path of the monitoring signal, that is, a voltage between the second level down shifter 6a and the diode 7. Consequently, the diode 7 is conducting and an ON state monitoring signal of the switching device 5 represented as a collector voltage is transmitted to the second logic device 3 and the first logic device 2 via the diode 7 and the second down shifter 6a in Operation S7.

Also, in Operation S8, when the switching device 5 is in an OFF state, a voltage difference between the emitter 5b and the collector 5c is increased to ten to tens of volts.

Therefore, the collector voltage is increased to tens of volts to be greater than a voltage at the transmission path of the monitoring signal, that is, a voltage between the second level down shifter 6a and the diode 7. As a result, the diode 7 is not conducting and an OFF state monitoring signal of the switching device 5 represented as the collector voltage is not transmitted to the post-stage circuit of the diode 7 so that the second logic device 3 and the first logic device 2 do not receive the OFF state monitoring signal.

In addition, an ON state monitoring signal of the switching device 5 represented by a gate voltage of about 12 to 20 volts thereof is also transmitted to the second logic device 3 through the first level down shifter 6b. And, the ON state monitoring signal is transmitted to the first logic device 2 through the third level down shifter 6c in Operation S8.

Further, in Operation S8, when the switching device 5 is in an OFF state, an OFF state monitoring signal of the switching device 5 represented by a gate voltage close to about 0 volts thereof is also transmitted to the second logic device 3 through the first level down shifter 6b. And, the OFF state monitoring signal is transmitted to the first logic device 2 through the third level down shifter 6c.

Then, each of the second logic device 3 and the first logic device 2 compares the collector voltage and the gate voltage with reference voltage values (that is, a reference collector voltage value and a reference gate voltage value which are predetermined when a switching device is in an ON state) through internal logic circuits such as a comparator, an AND gate and the like which are not shown. Thereafter, an ON state or an OFF state of the switching device 5 is exactly determined by performing a logical operation (for example, an AND operation) on two comparison results through the internal logic circuits in Operation S9.

The monitoring signals regarding an ON state or an OFF state of the switching device 5, which are determined by the second logic device 3 and the first logic device 2, respectively, are transmitted to the controller 1.

Then, the controller 1 compares values with each other whether or not the values are the same as each other, which are represented by the monitoring signals regarding an ON state or an OFF state of the switching device 5 and determined by the second logic device 3 and the first logic device 2, respectively. Therefore, an abnormality occurrence of the second logic device 3 or the first logic device 2 may be determined in Operation S10.

Here, when the values are the same as each other, which are represented by the monitoring signals regarding an ON state or an OFF state of the switching device 5 and determined by the second logic device 3 and the first logic device 2, respectively, the controller 1 may determine that the second logic device 3 and the first logic device 2 are normal in Operation S11.

On the other hand, when the values are different from each other, which are represented by the monitoring signals regarding an ON state or an OFF state of the switching device 5 and determined by the second logic device 3 and the first logic device 2, respectively, the controller 1 may determine that an abnormality (malfunction) occurs in one of the second logic device 3 and the first logic device 2 in Operation S12.

Also, by considering the ON or OFF control instruction signal output originally from the controller 1 as well as whether or not the values are the same as each other, which are represented by the monitoring signals regarding an ON state or an OFF state of the switching device 5 and determined by the second logic device 3 and the first logic device 2, respectively, the controller 1 may exactly determine a logic device in which an abnormality (malfunction) occurs out of the second logic device 3 and the first logic device 2 in Operations S13 and S14.

That is, in a state that the controller 1 has output an ON control instruction signal for example, the second logic device 3 provides a monitoring signal representing an ON state of the switching device 5 to the controller 1. And, if the first logic device 2 has provided the controller 1 with a monitoring signal representing an OFF state of the switching device 5, the controller 1 may determine an abnormality (malfunction) occurrence of the first logic device 2.

As described above, the driving circuit of a switching device for an electric power control according to some embodiments of the present disclosure may provide effectiveness capable of improving reliability of an ON/OFF control and a monitoring operation of a switching device in comparison with the related art by configuring a logic device and/or a driver circuit in plural numbers.

Also, effectiveness may be provided to prevent an occurrence of a breakdown of the ON/OFF control and the monitoring operation of the switching device even when a malfunction occurs in any one of the driver circuits, since the driver circuit unit is configured with a plurality of driver circuits.

In addition, by means of the logic circuits included in the controller or the process program, when the monitoring signals regarding an ON state or an OFF state of the switching device are different from each other, which are received from the first logic device and the second logic device, respectively, the controller determines that one of the first logic device and the second logic device is abnormal. Therefore, effectiveness may be provided to monitor whether or not the logic devices are in a normal state.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A driving circuit of a switching device for an electric power control, comprising:
    a driver circuit unit configured to be connected to a switching device and configured to control the switching device to an ON state or an OFF state;
    a first logic device configured to be connected to the switching device and the driver circuit unit and configured to transmit an ON or OFF control signal regarding the switching device to the driver circuit unit or to provide a monitoring signal detecting the ON state or the OFF state of the switching device to the driver circuit unit;
    a second logic device configured to be connected to the switching device and the first logic device and configured to transmit the ON or OFF control signal regarding the switching device to the first logic device or to provide the monitoring signal detecting the ON state or the OFF state of the switching device to the first logic device; and
    a controller configured to be connected to the first logic device and the second logic device and configured to provide an ON or OFF control instruction signal regarding the switching device to at least one of: the first logic device or the second logic device,
    wherein the controller determines an abnormal state of at least one of the first logic device and the second logic device based on the monitoring signals received from the first logic device and the second logic device.

2. The driving circuit of claim 1, wherein the driver circuit unit includes a plurality of driver circuits configured to be connected to the switching device and configured to control the switching device to be turn on or off.

3. The driving circuit of claim 1, wherein the first logic device and the second logic device are configured to be connected to the switching device configured to receive the monitoring signal detecting the ON state or the OFF state of the switching device.

4. The driving circuit of claim 3, further comprising:
at least three level down shifters including a first level down shifter configured to be connected between the second logic device and the first terminal of the switching device, a second level down shifter configured to be connected between the second logic device and the second terminal of the switching device, and a third level down shifter configured to be connected between the first logic device and the first terminal of the switching device, respectively, and configured to lower a voltage level of the monitoring signal.

5. The driving circuit of claim 1, wherein when the monitoring signals regarding the ON state and the OFF state of the switching device are different from each other, which are configured to be received from the first logic device and the second logic device, respectively, the controller is configured to determine an abnormality in one of: the first logic device or the second logic device.

6. The driving circuit of claim 1, wherein the controller is configured to determine a logic device in which an abnormality occurs out of the first logic device and the second logic device based on the ON or OFF control instruction signal and the monitoring signals regarding the ON state or the OFF state of the switching device, which are configured to be received from the first logic device and the second logic device, respectively.

7. The driving circuit of claim 1, wherein each of the first logic device and the second logic device includes one of: a field programmable gate array (FPGA), a microcomputer unit (MCU), a complex programmable logic device (CPLD), or an application-specific integrated circuit (ASIC).

8. The driving circuit of claim 4, wherein the level down shifters include one of: a resistor rail, a comparator, or an operational amplifier.

* * * * *